United States Patent
Hosoi et al.

(10) Patent No.: US 7,439,523 B2
(45) Date of Patent: Oct. 21, 2008

(54) METHOD FOR PREPARING RADIATION IMAGE STORAGE PANEL

(75) Inventors: Yuichi Hosoi, Ashigara-kami-gun (JP); Satoshi Arakawa, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/514,080

(22) Filed: Sep. 1, 2006

(65) Prior Publication Data

US 2007/0054035 A1    Mar. 8, 2007

(30) Foreign Application Priority Data

Sep. 2, 2005    (JP)    ............... 2005-255295

(51) Int. Cl.
*H05B 33/10*    (2006.01)

(52) U.S. Cl. .................................................. 250/484.4
(58) Field of Classification Search ............... 250/484.4
See application file for complete search history.

(56) References Cited

U.S. PATENT DOCUMENTS

| 2001/0010831 A1 | 8/2001 | Fuchs et al. |
| 2004/0069955 A1 * | 4/2004 | Maezawa et al. ......... 250/484.4 |

FOREIGN PATENT DOCUMENTS

| JP | 05-070932 | 3/1993 |
| JP | 2004-085430 | 3/2004 |
| JP | 2004-257798 | 9/2004 |

* cited by examiner

*Primary Examiner*—Constantine Hannaher
*Assistant Examiner*—Marcus H Taningco
(74) *Attorney, Agent, or Firm*—Sughrue Mion, PLLC

(57) ABSTRACT

A radiation image storage panel composed of a substrate and a layer of stimulable phosphor is prepared in an evaporation chamber kept at a pressure of 0.1 to 10 Pa by the steps of heating a source of the stimulable phosphor in the chamber so that the source is evaporated to give a gaseous product and depositing the gaseous product on the substrate which is arranged above the source to form the layer of stimulable phosphor on the substrate, in which the evaporation chamber has a diffusion preventing wall member surrounding a space between the source and the substrate, a top of which is positioned in the vicinity of a periphery of the substrate and a bottom of which is positioned in the vicinity of the source; and the diffusion preventing wall member is maintained at a temperature lower than a temperature of the source and higher than a temperature of the substrate.

12 Claims, 2 Drawing Sheets

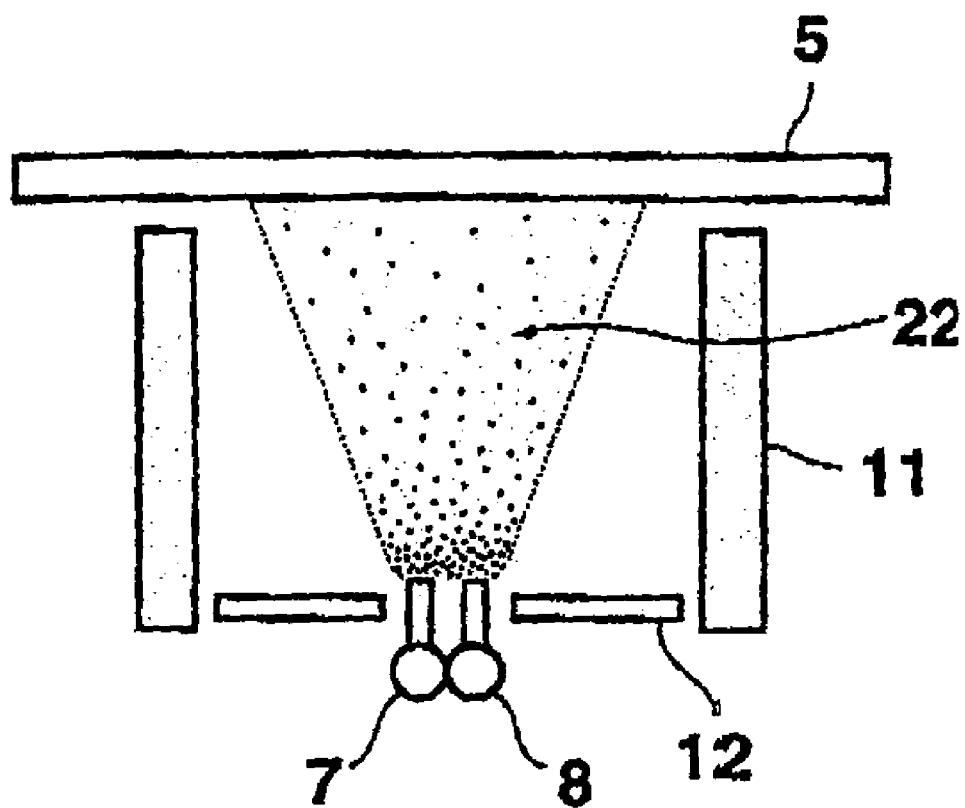
PRIOR ART

METHOD FOR PREPARING RADIATION IMAGE STORAGE PANEL

FIELD OF THE INVENTION

The present invention relates to a method for preparation of a radiation image storage panel which is employable in a radiation image recording and reproducing method.

BACKGROUND OF THE INVENTION

When exposed to radiation such as X-rays, an energy-storing phosphor (stimulable phosphor, which gives off stimulated emission) absorbs and stores a portion of the radiation energy. The phosphor then emits stimulated emission according to the level of the stored energy when exposed to electromagnetic wave such as visible or infrared light (i.e., stimulating light). A radiation image recording and reproducing method utilizing the energy-storing phosphor has been widely employed in practice. In that method, a radiation image storage panel, which is a sheet having the energy-storing phosphor, is used. The method comprises the steps of: exposing the storage panel to radiation having passed through an object or having radiated from an object, so that radiation image information of the object is temporarily recorded in the storage panel; sequentially scanning the storage panel with stimulating light such as a laser beam to emit stimulated light; and photoelectrically detecting the emitted light to obtain electric image signals. The storage panel thus treated is then subjected to a step for erasing radiation energy remaining therein, and then stored for the use in the next recording and reproducing procedure. Thus, the radiation image storage panel can be repeatedly used.

The radiation image storage panel (often referred to as energy-storing phosphor sheet) has a basic structure comprising a support (substrate) and a phosphor layer provided thereon. Further, a protective layer is generally provided on the free surface (surface not facing the support) of the phosphor layer so as to keep the phosphor layer from chemical deterioration or physical damage.

Various kinds of energy-storing phosphor layers are known. For example, the phosphor layer can comprise a binder and energy-storing phosphor particles dispersed therein, or otherwise can comprise agglomerate of an energy-storing phosphor without binder. The latter layer can be formed, for example, by a gas phase-accumulation method. In the gas phase-accumulation method, a phosphor source is vaporized or sputtered so that the phosphor would be deposited and accumulated on a substrate to form a layer of the phosphor in the form of columnar crystals. The phosphor layer thus formed by the gas phase-accumulation method contains no binder and consists of only the phosphor, and there are gaps among the columnar crystals of the phosphor. Because of presence of the gaps, the stimulating light can stimulate the phosphor efficiently and the emitted light can be collected efficiently. Accordingly, the storage panel having the accumulated phosphor layer has high sensitivity. Moreover, since the gaps prevent the stimulating light from diffusing parallel to the layer, the storage panel can give a reproduced image of high sharpness.

The radiation image recording and reproducing method (or radiation image forming method) has various advantages as described above. It is still desired that the radiation image storage panel used in the method have as high sensitivity as possible and, at the same time, give a reproduced radiation image of as high quality (in regard to sharpness and graininess) as possible.

U.S. Patent Publication No. 2001/0010831 A1, JP-A-2004-85430 and JP-A-2004-257798 disclose a process for preparation of a radiation image storage panel. In the disclosed process, stimulable phosphors such as CsBr:Eu are vaporized, deposited and accumulated on a substrate under a medium vacuum (approx. 0.1 to 10 Pa) to form a phosphor layer.

The vapor-deposition procedure is conducted in an apparatus in which the substrate is placed at a position facing to an evaporation source. The evaporation source is heated to generate a stream of vaporized substance, which flows onto the surface of the substrate and then deposits and accumulates thereon. From the viewpoint of productivity, the deposition efficiency (a ratio of amount of accumulated substance/amount of evaporated substance) is preferably as high as possible. On the other hand, from the viewpoint of quality of the resultant storage panel, the deposited phosphor layer preferably has an even thickness. Moreover, in consideration of emission properties, it is also desired that the deposited phosphor be uniform and be in the form of good columnar crystals.

JP-A-5-70932 discloses a vapor-deposition apparatus comprising a covering plate equipped with a heating means. In the apparatus, an evaporation source is heated so that vaporized substance is deposited on a substrate facing to the evaporation source. The covering plate is provided so as to surround a space from the evaporation source to the position where the substrate is placed. In the vapor-deposition procedure, the apparatus is evacuated to a high vacuum of $10^{-4}$ to $10^{-5}$ torr ($1.33 \times 10^{-2}$ to $1.33 \times 10^{-3}$ Pa). It is described that the covering plate is heated to re-vaporize a deposited phosphor source once deposited on the covering plate. Therefore the covering plate is equipped with a heating means, and thereby the deposition efficiency can be improved.

It has been now noted by the present applicants that a stream of gaseous product under high vacuum (at a vacuum degree lower than 0.1 Pa) generally diffuses but broadens linearly as the stream approaches the substrate, as shown in FIG. 3 (5: substrate, 7, 8: resistance heaters, 11, 12: diffusion preventing walls, 22: stream of gaseous product). In contrast, as shown in FIG. 2 (21: stream of gaseous product), the stream of gaseous product under medium vacuum (0.1 to 10 Pa) diffuses and spreads all over the space because a small amount of gas such as Ar gas still remains under medium vacuum. The gaseous product partly comes into collision with the remaining gas such as Ar gas before the stream reaches the substrate, and consequently scatters in the whole space between the evaporation source and the substrate. The deposition efficiency under medium vacuum is, therefore, even more serious than that under high vacuum.

In addition, it has been noted that the deposition efficiency is further serious particularly in the case where a phosphor layer of radiation image storage panel is formed by the vapor-deposition procedure. The phosphor generally comprises at least two components: matrix component and activator component. If the temperature at which one has a predetermined vapor pressure is very different from the temperature at which the other has the same vapor pressure (for example, the CsBr matrix component of CsBr:Eu phosphor has the vapor pressure of 1.33 Pa at 556 K, while the activator compound $EuBr_2$ has that vapor pressure at 1013 K), the compound of the lower temperature (i.e., $EuBr_2$ in the above example) shows an extremely poor deposition efficiency in the vapor-deposition procedure. As a result, the components of the deposited phosphor layer are often not uniform or very different from the designed ones, and accordingly a radiation image storage panel comprising thus-formed phosphor layer has low sensitivity.

It has been further noted that when the covering plate is heated to vaporize again the substance deposited on the plate, splashing is often caused although the deposition efficiency can be improved. The phosphor layer formed on the substrate in that way comprises a phosphor in the form of coarse columnar crystals or has a rough surface, and accordingly the reproduced radiation image is liable to have points defects.

SUMMARY OF THE INVENTION

It is an object of the present invention to provide a method for preparing a radiation image storage panel in which the deposition efficiency is high enough to produce a storage panel giving a radiation image of high quality with high sensitivity.

It is another object of the invention to provide a method for preparing a radiation image storage panel in which the deposition efficiency is high enough to form a uniformly deposited phosphor layer.

The applicants have studied the above-mentioned problems, and finally found that the deposition efficiency can be improved and, at the same time, that the phosphor layer can be uniformly formed by providing a diffusion preventing wall whose temperature is properly adjusted. The diffusion preventing wall member is placed so as to surround a space from tXthe evaporation source to the substrate, and thereby substance vaporized under medium vacuum is prevented from diffusing and leaking out of the space. Further, the temperature of the diffusion preventing wall is adjusted to be higher than the temperature of the substrate but lower than the temperature of the evaporation source, and thereby the vaporized substance (i.e., gaseous product) is effectively prevented from depositing onto the wall and, even in the case that the gaseous product is deposited on the wall, the deposited product is effectively prevented from vaporizing again.

The present invention resides in a method for preparing a radiation image storage panel comprising a substrate and a layer of stimulable phosphor arranged thereon in an evaporation chamber maintained at a pressure of 0.1 to 10 Pa which comprises a step of heating a source of the stimulable phosphor in the evaporation chamber, whereby the source is evaporated to give a gaseous product and a subsequent step of depositing the gaseous product on the substrate which is arranged above the source, whereby the layer of stimulable phosphor is formed on the substrate, in which the evaporation chamber has a diffusion preventing wall member surrounding a space between the source and the substrate, a top of which is positioned in the vicinity of a periphery of the substrate and a bottom of which is positioned in the vicinity of the source; and the diffusion preventing wall member is maintained at a temperature lower than a temperature of the source and higher than a temperature of the substrate.

In the method of the invention, since the diffusion preventing wall member prevents the gaseous product from diffusing and leaking away and from depositing on the wall member, the deposition efficiency is improved enough to produce a radiation image storage panel in better productivity than ever even if the vapor-deposition procedure is conducted under medium vacuum. Further, even if the gaseous substance is attached onto the wall member, the attached substance is prevented from vaporizing again and hence splashing is effectively avoided. Accordingly, the layer deposited on the substrate consists of the phosphor in the form of good columnar crystals and has a smooth surface, and as a result, the produced radiation image storage panel has high sensitivity and can give a reproduced radiation image of high quality.

BRIEF DESCRIPTION OF DRAWINGS

FIG. 3 is a sectional view schematically illustrating how a stream of vaporized substance diffuses under high vacuum (<0.1 Pa).

DETAILED DESCRIPTION OF THE INVENTION

Figure 1:
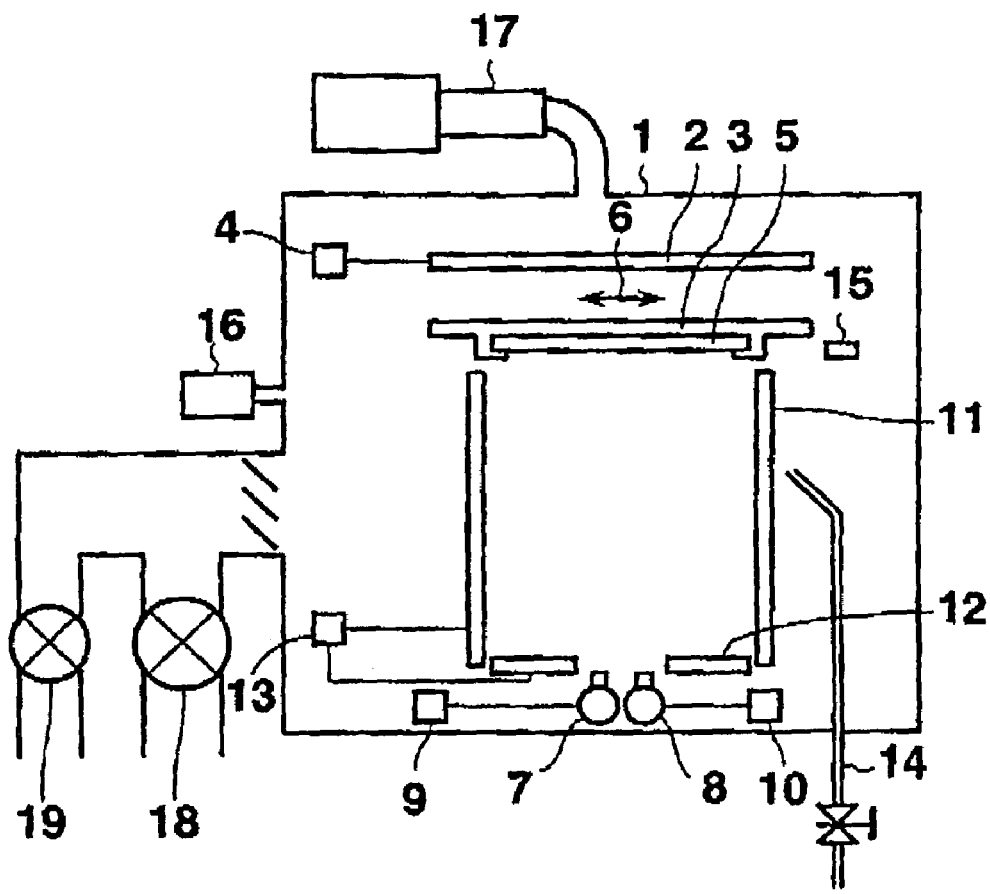
FIG. 1 is a sectional view schematically illustrating an example of the vapor-deposition apparatus employed for the method of the invention.

Preferred embodiments of the invention are as follows.

(1) The temperature of the substrate is kept in the range of 20° C. to 350° C., preferably 100 to 250° C.

(2) The vacuum degree is kept in the range of 0.5 to 1.5 Pa.

(3) The substrate is positioned apart from the source by 50 to 300 mm.

(4) The vapor-deposition procedure is carried out according to the resistance-heating method.

(5) The source is heated to a temperature not lower than 600° C.

(6) The diffusion preventing wall member is kept at a temperature in the range of 200 to 500° C.

(7) The difference between the temperature of the diffusion preventing wall member and the temperature of the source is in the range of 100 to 1,000° C. The temperature of the source is meant to the lowest temperature when two or more phosphor sources (i.e., evaporation sources) are employed and heated to different temperatures.

(8) The difference between the temperature of the substrate and the temperature of the diffusion preventing wall member is in the range of 30 to 200° C.

(9) The source of stimulable phosphor comprises at least one phosphor matrix compound and at least one activator compound.

(10) The stimulable phosphor is an alkali metal halide stimulable phosphor represented by the formula (I):

$$M^{I}X.aM^{II}X'_{2}.bM^{III}X''_{3}:zA \quad (I)$$

in which $M^{I}$ is at least one alkali metal selected from the group consisting of Li, Na, K, Rb and Cs; $M^{II}$ is at least one alkaline earth metal or divalent metal selected from the group consisting of Be, Mg, Ca, Sr, Ba, Ni, Cu, Zn and Cd; $M^{III}$ is at least one rare earth element or trivalent metal selected from the group consisting of Sc, Y, La, Ce, Pr, Nd, Pm, Sm, Eu, Gd, Tb, Dy, Ho, Er, Tm, Yb, Lu, Al, Ga and In; each of X, X' and X" is independently at least one halogen selected from the group consisting of F, Cl, Br and I; A is at least one rare earth element or metal selected from the group consisting of Y, Ce, Pr, Nd, Sm, Eu, Gd, Tb, Dy, Ho, Er, Tm, Yb, Lu, Mg, Cu and Bi; and a, b and z are numbers satisfying the conditions of $0 \leq a < 0.5$, $0 \leq b < 0.5$ and $0 \leq z < 1.0$, respectively.

(11) In the formula (I), $M^{I}$, X, A and z are Cs, Br, Eu and a number satisfying the condition of $1 \times 10^{-4} \leq z \leq 0.1$, respectively.

The vapor-deposition unit in the apparatus of the invention employable for performing the method of the invention preferably comprises a substrate-heating means, a substrate temperature controlling means connecting to the substrate-heating means, a resistance heater, and an evaporation source temperature controlling means connecting to the resistance heater. These means can be preferably controlled so that the temperature of the diffusion preventing wall member can be kept higher than the temperature of the substrate but lower than the temperature of the evaporation source.

In the following description, the method of the invention is explained in detail referring to the attached drawings, by way of example, in the case where a vapor-deposition procedure of resistance-heating method is adopted.

The substrate on which the deposited phosphor layer is to be formed is generally used as a support of the storage panel, and hence can be optionally selected from known materials conventionally used as a support of storage panel. The substrate preferably is a sheet of quartz glass, sapphire glass; metal such as aluminum, iron, tin or chromium; or resin such as aromatic polyimide. For improving the sensitivity or the image quality (e.g., sharpness and graininess), known auxiliary layers such as a light-reflecting layer (which contains a light-reflecting material such as titanium dioxide) and a light-absorbing layer (which contains a light-absorbing material such as carbon black) can be optionally provided according to the aim and use of the storage panel. Further, in order to promote growth of the columnar crystals, a great number of very small convexes or concaves may be provided on the substrate surface (or on the auxiliary layer such as an undercoating (adherent) layer, a light-reflecting layer or a light-absorbing layer, if provided) on which the vapor is to be deposited.

The energy-storing phosphor is preferably a stimulable phosphor giving off stimulated emission in the wavelength region of 300 to 500 nm when exposed to stimulating rays in the wavelength region of 400 to 900 nm.

Particularly preferred is an alkali metal halide stimulable phosphor represented by the formula (I):

$$M^{I}X \cdot aM^{II}X'_2 \cdot bM^{III}X''_3 : zA \tag{I}$$

in which $M^{I}$ is at least one alkali metal selected from the group consisting of Li, Na, K, Rb and Cs; $M^{II}$ is at least one alkaline earth metal or divalent metal selected from the group consisting of Be, Mg, Ca, Sr, Ba, Ni, Cu, Zn and Cd; $M^{III}$ is at least one rare earth element or trivalent metal selected from the group consisting of Sc, Y, La, Ce, Pr, Nd, Pm, Sm, Eu, Gd, Tb, Dy, Ho, Er, Tm, Yb, Lu, Al, Ga and In; A is at least one rare earth element or metal selected from the group consisting of Y, Ce, Pr, Nd, Sm, Eu, Gd, Tb, Dy, Ho, Er, Tm, Yb, Lu, Mg, Cu and Bi; each of X, X' and X" is independently at least one halogen selected from the group consisting of F, Cl, Br and I; and a, b and z are numbers satisfying the conditions of $0 \leq a < 0.5$, $0 \leq b < 0.5$ and $0 < z < 1.0$, respectively.

The number represented by z in the formula (I) preferably satisfies the condition of $1 \times 10^{-4} \leq z \leq 0.1$. The phosphor of the formula (I) preferably contains at least Cs as $M^{I}$ and at least Br as X. In the formula (I), A is preferably Eu or Bi, more preferably Eu. Further, the phosphor of the formula (I) can contain metal oxides such as aluminum oxide, silicon dioxide and zirconium oxide, if needed, in an amount of 0.5 mol or less per 1 mol of $M^{I}X$.

It is also preferred to use a rare earth activated alkaline earth metal fluoride halide stimulable phosphor represented by the formula (II):

$$M^{II}FX : zLn \tag{II}$$

in which $M^{II}$ is at least one alkaline earth metal selected from the group consisting of Ba, Sr and Ca; Ln is at least one rare earth element selected from the group consisting of Ce, Pr, Sm, Eu, Tb, Dy, Ho, Nd, Er, Tm and Yb; X is at least one halogen selected from the group consisting of Cl, Br and I; and z is a number satisfying the condition of $0 < z \leq 0.2$.

Further preferred is a rare earth activated alkaline earth metal sulfide stimulable phosphor represented by the formula (III):

$$M^{II}S : A, Sm \tag{III}$$

in which $M^{II}$ is at least one alkaline earth metal selected from the group consisting of Mg, Ca and Sr; and A preferably is Eu and/or Ce.

Further, yet another preferred phosphor is a cerium activated trivalent metal oxide halide stimulable phosphor represented by the formula (IV):

$$M^{III}OX : Ce \tag{IV}$$

in which $M^{III}$ is at least one rare earth element or trivalent metal selected from the group consisting of Pr, Nd, Pm, Sm, Eu, Tb, Dy, Ho, Er, Tm, Yb and Bi; and X is at least one halogen selected from the group consisting of Cl, Br and I.

The phosphor used in the invention is not restricted to the above-mentioned stimulable phosphor. It may be a phosphor absorbing radiation such as X-ray and instantly giving off (instant) emission in the ultraviolet or visible resin. Examples of that phosphor include phosphors of $LnTaO_4$:(Nb, Gd) type, $Ln_2SiO_5$:Ce type and LnOX:Tm type (Ln is a rare earth element); CsX (X is a halogen) type; $Gd_2O_2S$:Tb; $Gd_2O_2S$:Pr,Ce; $ZnWO_4$; $LuAlO_3$:Ce; $Gd_3Ga_5O_{12}$:Cr,Ce; and $HfO_2$.

In the case where the vapor-deposited phosphor layer is formed by multi-vapor deposition (co-deposition), at least two evaporation sources are used. One of the sources contains matrix material of the phosphor, and the other contains activator material. The multi-vapor deposition is preferred because the vaporization rate of each source can be independently controlled to incorporate the activator homogeneously in the matrix even if the materials have very different melting points or vapor pressures. According to the composition of the desired phosphor, each evaporation source may consist of the matrix material or the activator material only or otherwise may be a mixture thereof with additives. Three or more sources can be used. For example, in addition to the above sources, another evaporation source containing additives may be used.

The matrix material of the phosphor may be either a matrix compound itself or a mixture of two or more substances that react with each other to produce the matrix compound. The activator material is generally a compound containing an activating element, and hence is, for example, a halide or oxide of the activating element.

If the activator is Eu, the Eu-containing compound of the activator material preferably contains $Eu^{2+}$ as much as possible because the aimed stimulated emission (even if, instant emission) is emitted from the phosphor activated by $Eu^{2+}$. Since contaminated with oxygen, commercially available Eu-containing compounds generally contain both $Eu^{2+}$ and $Eu^{3+}$. The Eu-containing compounds, therefore, are preferably melted under Br gas-atmosphere so that oxygen-free $EuBr_2$ can be prepared to use.

The evaporation source preferably contains water in a content of 0.5 wt. % or less. For preventing the source from bumping, it is particularly important to control the water content in the above low range if the material of matrix or activator is a hygroscopic substance such as EuBr or CsBr. The materials are preferably dried by heating at 100 to 300° C. under reduced pressure. Otherwise, the materials may be heated under dry atmosphere such as nitrogen gas atmosphere to melt at a temperature above the melting point for several minutes to several hours.

The evaporation source, particularly the source of the matrix material, contains impurities of alkali metal (alkali metals other than ones constituting the phosphor) preferably in a content of 10 ppm or less and impurities of alkaline earth metal (alkaline earth metals other than ones constituting the phosphor) preferably in a content of 5 ppm or less (by weight). That is particularly preferred if the phosphor is an alkali metal halide stimulable phosphor represented by the formula (I). Such preferred evaporation source can be prepared from materials containing the impurities little.

In the invention, a deposited phosphor layer can be formed on a substrate in the vapor-deposition unit shown in FIG. 1.

FIG. 1 is a sectional view schematically illustrating an example of the vapor-deposition unit for performing the method of the invention. The unit shown in FIG. 1 comprises a chamber 1, a substrate-heating means 2, a substrate holder 3, a substrate temperature controlling means 4, resistance-heaters 7 and 8, evaporation source temperature controlling means 9 and 10, diffusion preventing wall members 11 and 12, a thermostat 13, a gas-intake pipe 14, a deposition rate monitor 15, a vacuum gauge 16, a gas analyzer 17, a main exhaust valve 18, and an auxiliary exhaust valve 19.

In the invention, the diffusion preventing wall members 11 and 12 are placed to surround a space formed between the resistance-heaters (evaporation sources) 7 and 8 and the substrate 5 held in the substrate holder 3. The distance between each evaporation source and the substrate 5 is normally in the range of 10 to 1,000 mm, preferably in the range of 50 to 300 mm. The distance between the evaporation sources 7a and 8a generally is in the range of 10 to 1,000 mm, preferably in the range of 20 to 150 mm. It is preferred that at least 80% of the space be covered with the diffusion preventing wall members 11, 12, the substrate 5 and the resistance-heaters 7, 8. The diffusion preventing wall members 11, 12 are, for example, ceramic or metal plates behind which heaters are provided. Further, the diffusion preventing wall members 11, 12 are equipped with the thermostat 13 so that the temperature of the wall members can be freely controlled.

First, in the vapor-deposition procedure, the evaporation sources are individually stuffed into the crucibles of the resistance heaters 7 and 8. Independently, the substrate 5 is mounted onto the substrate holder 3. The chamber 1 is then evacuated through the main exhaust valve 18 and the auxiliary exhaust valve 19, to make the inner pressure in the range of 0.1 to 10 Pa, preferably 0.1 to 4 Pa (medium vacuum). Preferably after the chamber 1 is evacuated to make the inner pressure in the range of $1 \times 10^{-5}$ to $1 \times 10^{-2}$ Pa (high vacuum), an inert gas such as Ar, Ne or $N_2$ gas is introduced through the intake pipe 14 so that the inner pressure would be in the range of 0.1 to 10 Pa, preferably 0.1 to 4 Pa. In that way, partial pressures of water and oxygen in the chamber 1 can be reduced. The degree of vacuum in the chamber 1 is monitored with the vacuum gauge 16, and the partial pressures of gases are monitored with the gas analyzer 17. The chamber 1 can be evacuated by means of an optional combination of, for example, a rotary pump, a turbo molecular pump, a cryo pump, a diffusion pump and a mechanical buster.

During the procedure, the substrate 5 is moved linearly in the direction indicated by the arrow 6. The substrate 5 may be only once shifted in one way, or may be moved forward and backward only once or repeatedly. The moving rate can be optionally determined according to the times of moving forward and backward and the aimed thickness of the deposited phosphor layer. The substrate 5 may be heated from the back by means of the substrate heating means 2. The temperature of the substrate can be freely controlled by means of the substrate temperature controlling means 4 connecting to the substrate heating means 2, and is generally in the range of 20 to 350° C., preferably in the range of 100 to 250° C.

The temperature of the diffusion preventing wall members 11, 12 is controlled by means of the thermostat 13 to be higher than the temperature of the substrate 5 but lower than the temperature of the evaporation source. For example, the temperature of the diffusion preventing wall members is controlled in the range of 200 to 500° C., if the temperatures of the substrate and the evaporation source are in the ranges of 100 to 250° C. and more than 600° C., respectively.

For heating the evaporation sources, electric currents are then supplied to the resistance heaters 7 and 8. The temperatures of the evaporation sources can be individually controlled at desired temperatures by means of the evaporation source temperature controlling means 9 and 10 connecting to the resistance heaters 7 and 8, respectively. The evaporation sources, which are matrix and activator components of stimulable phosphor, are thus heated and vaporized to form a stream of vaporized substance.

Figure 2:
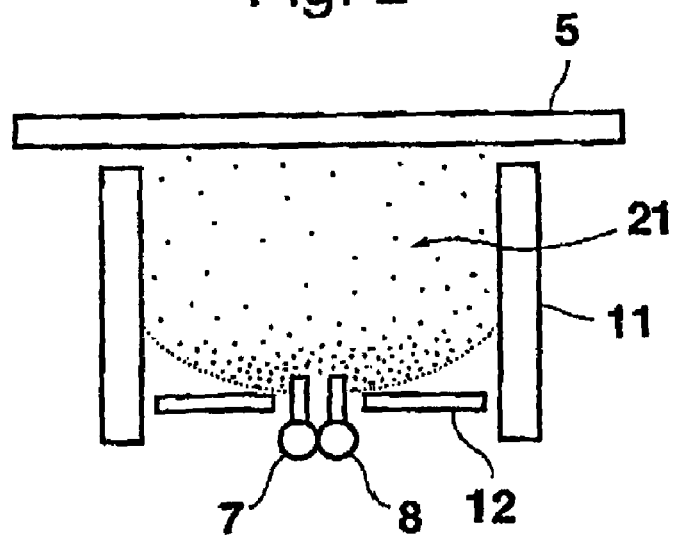
FIG. 2 is a sectional view schematically illustrating how a stream of vaporized substance (i.e., gaseous product) diffuses under medium vacuum (0.1 to 10 Pa).

FIG. 2 is a sectional view schematically showing a part of the vapor-deposition unit shown in FIG. 1. The part shown in FIG. 2 is a space surrounded with the substrate 5, the resistance heaters 7 and 8 (evaporation sources) and the diffusion preventing wall members 11 and 12. FIG. 2 illustrates how the stream of vaporized substance 21 diffuses in the space under medium vacuum (0.1 to 10 Pa). Since a small amount of gas such as inert gas still remains under medium vacuum, the vaporized substance 21 comes into collision with the remaining gas before reaches the substrate 5 and hence are scattered all over the space.

FIG. 3 illustrates how the stream of vaporized substance 22 under high vacuum (<0.1 Pa) diffuses in the space surrounded with the substrate 5, the resistance heaters 7 and 8 (evaporation sources) and the diffusion preventing wall members 11 and 12.

In the invention, the diffusion preventing wall members 11 and 12 make the vaporized substance 21 less diffuse and hence less leak away from the space. If 80% or more of the space is covered with the diffusion preventing wall members and other members, the vaporized substance 22 is more effectively prevented from leaking away. Further, since the diffusion preventing wall members 11 and 12 are controlled with the thermostat so that the temperature of the diffusion preventing wall members would be higher than the temperature of the substrate 5 but lower than the temperature of the evaporation sources, the vaporized substance 21 hardly attaches onto the walls and, even if the substance is attached, the attached substance is prevented from vaporizing again. In this way, the deposition efficiency of the vaporized substance 21 onto the substrate 5 can be improved while splashing in the re-evaporation is avoided.

Particularly in the case where a material having high vaporizing temperature (for example, activator component $EuBr_2$) is used as the evaporation source, the deposition efficiency is remarkably improved by the present invention. Since the activator component is efficiently vaporized and deposited, the phosphor layer can be homogeneously constituted of desired components. Consequently, the amount of emission given off from the phosphor layer is enhanced enough to improve the sensitivity of the resultant radiation image storage panel. Further, since the splashing in the re-evaporation is avoided, the deposited layer consists of phosphor in the form of such good columnar crystals and has such a smooth surface that the resultant storage panel gives a reproduced radiation image of high quality (e.g., high sharpness) without point defects. Moreover, because of the phosphor in good columnar crystals, the amount of emission is further enhanced.

The substances vaporized from the evaporation sources are reacted with each other to form the phosphor, which is deposited and accumulated on the substrate 5. The deposition rate, which means how fast the formed phosphor is deposited and accumulated on the substrate, can be controlled by adjusting the electric currents supplied to the resistance heaters 7 and 8. The deposition rate of each vaporized phosphor component can be detected with the monitor 15 at any time during the deposition. The deposition rate is generally in the range of 0.1 to 1,000 μm/minute, preferably in the range of 1 to 100 μm/minute.

The heating may be repeated twice or more to form two or more phosphor layers. After the deposition procedure is complete, the deposited layer may be subjected to heating treatment (annealing treatment), which is carried out generally at a temperature of 100 to 300° C. for 0.5 to 3 hours, preferably at a temperature of 150 to 250° C. for 0.5 to 2 hours, under inert gas atmosphere which may contain a small amount of oxygen gas or hydrogen gas.

Before preparing the phosphor layer, another layer consisting of the phosphor matrix alone may be beforehand formed. The layer of the phosphor matrix alone generally comprises agglomerate of columnar or spherical crystals, and the phosphor layer formed thereon is well crystallized in the form of columnar shape. In the thus-formed layers, the additives such as the activator contained in the phosphor-deposited layer are often diffused into the matrix alone-deposited layer while they are heated during the deposition and/or during the heating treatment performed after the deposition, and consequently the interface between the layers is not always clear.

The vapor-deposition unit usable in the invention is not restricted to FIG. 1. For example, plural pairs of the evaporation sources may be arranged perpendicular to the moving direction of the substrate. Further, only one evaporation source or three or more evaporation sources may be used. In the case where the phosphor layer is produced by mono-vapor deposition, only one evaporation source containing the phosphor or a mixture of materials thereof is heated in a single resistance heater. The evaporation source is beforehand prepared so that it may contain the activator in a desired amount. Otherwise, in consideration of the difference of vapor pressure between the matrix component and the activator, the deposition procedure may be carried out while the matrix component is being supplied to the evaporation source. Further, the evaporation sources are heated not necessarily with resistance heaters, and they may be heated with application of electron beams or other known means.

The thus-produced phosphor layer consists of a phosphor in the form of columnar crystals grown almost in the thickness direction. The phosphor layer contains no binder and consists of the phosphor only, and there are gaps among the columnar crystals. The thickness of the phosphor layer depends on, for example, aimed characteristics of the panel, conditions and process of the deposition, but is normally in the range of 50 μm to 1 mm, preferably in the range of 200 to 700 μm.

It is not always necessary for the substrate to be used as a support of the radiation image storage panel. For example, after formed on the substrate, the deposited phosphor film (layer) is peeled from the substrate and then laminated on a support with an adhesive to prepare the phosphor layer. Otherwise, the support (substrate) may be omitted.

It is preferred to provide a protective layer on the surface of the phosphor layer, so as to ensure good handling of the storage panel in transportation and to avoid deterioration. The protective layer is preferably transparent so as not to prevent the stimulating rays from coming in or not to prevent the emission from coming out. Further, for protecting the panel from chemical deterioration and physical damage, the protective layer preferably is chemically stable, physically strong, and of high moisture proof.

The protective layer can be provided by coating the phosphor layer with a solution in which an organic polymer such as cellulose derivatives, polymethyl methacrylate or fluororesins soluble in organic solvents is dissolved, by placing a beforehand prepared sheet (e.g., a film of organic polymer such as polyethylene terephthalate, a transparent glass plate) on the phosphor layer with an adhesive, or by depositing vapor of inorganic compounds on the phosphor layer. Various additives may be dispersed in the protective layer. Examples of the additives include light-scattering fine particles (e.g., particles of magnesium oxide, zinc oxide, titanium dioxide and alumina), a slipping agent (e.g., powders of perfluoroolefin resin and silicone resin) and a cross-linking agent (e.g., polyisocyanate). The thickness of the protective layer is generally in the range of about 0.1 to 20 μm if the layer is made of polymer material or in the range of about 100 to 1,000 μm if the layer is made of inorganic material such as glass.

EXAMPLE 1

(1) Evaporation Source

As the evaporation sources, a powdery cesium bromide (CsBr, purity: 4N or more) and a powdery europium bromide ($EuBr_2$, purity: 3N or more) were prepared. Each evaporation source was analyzed according to ICP-MS method (Inductively Coupled Plasma Mass Spectrometry), to find impurities. As a result, the CsBr powder was found to contain each of the alkali metals (Li, Na, K, Rb) other than Cs in an amount of 10 ppm or less and other elements such as alkaline earth metals (Mg, Ca, Sr, Ba) in amounts of 2 ppm or less. The $EuBr_2$ was also found to contain each of the rare earth elements other than Eu in an amount of 20 ppm or less and other elements in amounts of 10 ppm or less. These evaporation sources are very hygroscopic, and hence were stored in a desiccator keeping a dry condition whose dew point was −20° C. or below. Immediately before used, they were taken out of the desiccator.

(2) Preparation of Phosphor Layer

A glass substrate as a support (thickness: 8 mm) was washed successively with an aqueous alkaline solution, purified water and isopropyl alcohol. The thus-treated substrate was mounted on the substrate holder 3 in the vapor-deposition unit shown in FIG. 1. The CsBr and $EuBr_2$ evaporation sources 7a and 8a were individually stuffed in crucibles of the resistance heaters 7 and 8, respectively. The distance between each evaporation source and the substrate 5 was 150 mm. The chamber 1 was then evacuated to make the inner pressure $1\times10^{-3}$ Pa through the main exhaust valve 18 and the auxiliary exhaust valve 19 by means a combination of a rotary pump, a mechanical booster and a turbo molecular pump. Successively, Ar gas (purity: 5N) was introduced through the intake pipe 14 to set the inner pressure at 0.8 Pa. The substrate 5 was then heated to 220° C. by means of the substrate-heating means 2, and kept at 220° C. by means of the substrate temperature controlling means 4. The substrate 5 was linearly moved at the speed of 20 cm/minute in the direction indicated by the arrow 6. On the other hand, the diffusion preventing wall members 11 and 12 were heated and kept at 300° C. by means of the thermostat 13. The evaporation sources 7a and 8a were then heated at 680° C. and 1,100° C. by means of the resistance heaters 7, 8 and kept at 680° C. and 1,100° C. by means of the evaporation source temperature controlling means 9, 10, respectively, and thereby CsBr:Eu stimulable phosphor was deposited and accumulated on the substrate 5 at the rate of 6 μm/min. During the deposition, the electric currents supplied to the resistance heaters 7, 8 were controlled so that the molar ratio of Eu/Cs in the deposited phosphor might be 0.003/1. After the procedure was complete, the inner pressure of the chamber 1 was returned to atmospheric pressure and then the substrate 5 was taken out. On the substrate, a stimulable phosphor layer (thickness: 700 μm, area: 10 cm×10 cm) was formed. The formed layer consisted of the phosphor in the form of columnar crystals grown almost perpendicularly and aligned densely.

In this way, a radiation image storage panel comprising the support and the stimulable phosphor layer was produced through the co-deposition procedure according to the invention.

COMPARISON EXAMPLE 1

The procedure of Example 1 was repeated except that the diffusion preventing wall members 11 and 12 were heated and kept at 80° C. in the above step (2), to produce a radiation image storage panel for comparison.

COMPARISON EXAMPLE 2

The procedure of Example 1 was repeated except that the diffusion preventing wall members 11 and 12 were heated and kept at 800° C. in the above step (2), to produce a radiation image storage panel for comparison.

[Evaluation of Radiation Image Storage Panel]

With respect to each produced storage panel, the sensitivity, point defects and sharpness were evaluated. Further, the deposition efficiency (amount of substance accumulated on the substrate/amount of substance vaporized from the evaporation sources) of each example was measured.

(1) Sensitivity

Each radiation image storage panel was encased in a room light-shielding cassette and then exposed to X-rays (voltage: 80 kVp, current: 16 mA). The storage panel was then taken out of the cassette and excited with a He—Ne laser beam (wavelength: 633 nm), and sequentially the emitted stimulated emission was detected by a photomultiplier. On the basis of the detected stimulated emission intensity (converted into a relative value based on the intensity of Example 1), the sensitivity was evaluated.

(2) Point Defect

Each storage panel was encased in a room light-shielding cassette and then exposed to X-rays (10 mR). After the storage panel was taken out of the cassette, the stored image information was read out by means of a line-scan reading apparatus [stimulating rays: Ne—Ne laser beam (633 nm), light-receiving size of CCD=pixel size: 100 μm]. The obtained information was processed in an image-reproducing apparatus [image size: 200 μm] and output in the form of an image film. The output film was observed with the unaided eyes. On the basis of the number of point defects in an area (10 cm×10 cm) having relatively many point defects in the film, the storage panel was classified into the following three classes:

A: there are seen no point defects,

B: there are seen some point defects which are practically acceptable,

C: there are seen too many point defects to use practically.

(3) Sharpness

Each radiation image storage panel was exposed through a MTF chart to X-rays (tungsten tube, voltage: 80 kVp, 10 mR), and then a semi-conductor laser beam (wave-length: 660 nm) was linearly applied so that the stimulation energy on the panel surface might be 5 J/m². The stimulated emission given off from the panel surface was received with a line scanner (comprising many CCDs aligned linearly), and converted into electric signals. The obtained electric signals were processed by an image reproducing apparatus to reproduce an image on a display. From the reproduced image, the MTF (in relative value) at the spatial frequency of 1 c/mm was measured to determine the sharpness.

The results are shown in Table 1.

TABLE 1

| Ex. | Evaporation source | deposition efficiency | Temperatures walls | substrate | source |
|---|---|---|---|---|---|
| Ex. 1 | CsBr | 6.8% | 300° C. | 220° C. | 680° C. |
|  | EuBr₂ | 0.40% |  |  | 1,100° C. |
| Com. 1 | CsBr | 5.8% | 80° C. | 220° C. | 680° C. |
|  | EuBr₂ | 0.04% |  |  | 1,100° C. |
| Com. 2 | CsBr | 7.0% | 800° C. | 220° C. | 680° C. |
|  | EuBr₂ | 1.0% |  |  | 1,100° C. |

| Ex. | Vacuum degree | Sensitivity | Point defects | Sharpness |
|---|---|---|---|---|
| Ex. 1 | 0.8 Pa | 100 | A | 60% |
| Com. 1 | 0.8 Pa | 60 | A | 60% |
| Com. 2 | 0.8 Pa | 50 | C | 40% |

The results shown in Table 1 clearly indicate that the radiation image storage panel prepared according to the method of the invention (Example 1), in which the diffusion preventing wall members were heated at a temperature (300° C.) higher than the temperature of the substrate but lower than the temperature of the evaporation source in the vapor-deposition procedure, was produced with a better deposition efficiency and hence had better sensitivity than the panel of Comparison Example 1, in which the diffusion preventing wall members were heated at a lower temperature (80° C.). It should be noted that the deposition efficiency of EuBr₂, which has high vaporizing temperature, was particularly improved in Example 1. On the other hand, the storage panel of Comparison Example 2, in which the diffusion preventing wall members were heated at a higher temperature (800° C.), had poor sensitivity and gave a reproduced image having low sharpness and many point defects though it was produced with a relatively high deposition efficiency. That is because the re-evaporation was caused to form coarse columnar crystals of the phosphor and to roughen the surface of the deposited phosphor layer.

What is claimed is:

1. A method for preparing a radiation image storage panel comprising a substrate and a layer of stimulable phosphor arranged thereon in an evaporation chamber maintained at a pressure of 0.1 to 10 Pa which comprises a step of heating a source of the stimulable phosphor in the evaporation chamber, whereby the source is evaporated to give a gaseous product and a subsequent step of depositing the gaseous product on the substrate which is above the source, whereby the layer of stimulable phosphor is formed on the substrate, in which the evaporation chamber has a diffusion preventing wall member surrounding a space between the source and the substrate, a top of which is positioned in the vicinity of a periphery of the substrate and a bottom of which is positioned in the vicinity of the source; and the diffusion preventing wall member is maintained at a temperature lower than a temperature of the source and higher than a temperature of the substrate.

2. The method of claim 1, wherein the source is heated to a temperature not lower than 600° C.

3. The method of claim 1, wherein the substrate is kept at a temperature in the range of 20 to 350° C.

4. The method of claim 3, wherein the substrate is kept at a temperature in the range of 100 to 250° C.

5. The method of claim 1, wherein the diffusion preventing wall member is kept at a temperature in the range of 200 to 500° C.

6. The method of claim 1, wherein a difference between the temperature of the diffusion preventing wall member and the temperature of the source is in the range of 100 to 1,000° C.

7. The method of claim 1, wherein a difference between the temperature of the substrate and the temperature of the diffusion preventing wall member is in the range of 30 to 200° C.

8. The method of claim 1, wherein the source of stimulable phosphor comprises at least one phosphor matrix compound and at least one activator compound.

9. The method of claim 1, wherein the substrate is positioned apart from the source by 50 to 300 mm.

10. The method of claim 1, wherein the source is heated according to a resistance-heating method.

11. The method of claim 1, wherein the stimulable phosphor is an alkali metal halide stimulable phosphor represented by the formula (I):

$$M^I X \cdot a M^{II} X'_2 \cdot b M^{III} X''_3 : zA \qquad (I)$$

in which $M^I$ is at least one alkali metal selected from the group consisting of Li, Na, K, Rb and Cs; $M^{II}$ is at least one alkaline earth metal or divalent metal selected from the group consisting of Be, Mg, Ca, Sr, Ba, Ni, Cu, Zn and Cd; $M^{III}$ is at least one rare earth element or trivalent metal selected from the group consisting of Sc, Y, La, Ce, Pr, Nd, Pm, Sm, Eu, Gd, Tb, Dy, Ho, Er, Tm, Yb, Lu, Al, Ga and In; each of X, X' and X" is independently at least one halogen selected from the group consisting of F, Cl, Br and I; A is at least one rare earth element or metal selected from the group consisting of Y, Ce, Pr, Nd, Sm, Eu, Gd, Tb, Dy, Ho, Er, Tm, Yb, Lu, Mg, Cu and Bi; and a, b and z are numbers satisfying the conditions of $0 \leq a < 0.5$, $0 \leq b < 0.5$ and $0 < z < 1.0$, respectively.

12. The method of claim 11, wherein $M^I$, X, A and z in the formula (I) are Cs, Br, Eu and a number satisfying the condition of $1 \times 10^{-4} \leq z \leq 0.1$, respectively.

* * * * *